(12) United States Patent
Von Thun

(10) Patent No.: US 7,800,429 B2
(45) Date of Patent: Sep. 21, 2010

(54) TEMPERATURE INSENSITIVE REFERENCE CIRCUIT FOR USE IN A VOLTAGE DETECTION CIRCUIT

(75) Inventor: Matthew Von Thun, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 11/336,158

(22) Filed: Jan. 20, 2006

(65) Prior Publication Data

US 2007/0170977 A1    Jul. 26, 2007

(51) Int. Cl.
*G05F 1/10* (2006.01)

(52) U.S. Cl. .................. 327/513; 327/512; 327/538; 327/539

(58) Field of Classification Search .......... 327/512, 327/513, 535, 538–543; 323/312–314
See application file for complete search history.

(56) References Cited

U.S. PATENT DOCUMENTS

| | | | | |
|---|---|---|---|---|
| 5,182,468 A * | 1/1993 | Erdelyi et al. | ............. | 327/321 |
| 5,281,906 A * | 1/1994 | Thelen, Jr. | ............. | 323/313 |
| 5,532,578 A * | 7/1996 | Lee | ............. | 323/313 |
| 6,104,234 A * | 8/2000 | Shin et al. | ............. | 327/535 |
| 6,198,339 B1 * | 3/2001 | Gersbach et al. | ............. | 327/536 |
| 6,329,871 B2 * | 12/2001 | Taguchi | ............. | 327/539 |
| 6,686,797 B1 * | 2/2004 | Eker | ............. | 327/539 |
| 6,700,363 B2 * | 3/2004 | Tachimori | ............. | 323/313 |
| 6,930,948 B2 * | 8/2005 | Lee et al. | ............. | 365/226 |
| 7,518,437 B2 * | 4/2009 | Yamasaki | ............. | 327/543 |
| 7,622,906 B2 * | 11/2009 | Kushima et al. | ............. | 323/316 |
| 2005/0285635 A1 * | 12/2005 | Lee et al. | ............. | 327/77 |
| 2008/0297229 A1 * | 12/2008 | Ramamoorthy | ............. | 327/513 |

* cited by examiner

*Primary Examiner*—Lincoln Donovan
*Assistant Examiner*—Thomas J Hiltunen
(74) *Attorney, Agent, or Firm*—Peter J. Meza; William J. Kubida; Hogan Lovells US LLP

(57) ABSTRACT

A simple voltage detection circuit has few circuit elements, but provides a voltage output that is substantially temperature insensitive. The voltage detection circuit includes a diode-connected transistor, a cascode-connected transistor, as well as first and second resistors coupled between ground and a ramped power supply voltage. The diode-connected transistor exhibits a negative temperature coefficient. The on resistance of the cascode-connected transistor increases with temperature and thus the voltage dropped across the cascode-connected transistor also increases with temperature. By correctly sizing the cascode-connected device, the negative and positive temperature coefficients of the diode-connected and cascode-connected devices can be substantially cancelled out.

18 Claims, 5 Drawing Sheets

TEMPERATURE INSENSITIVE REFERENCE CIRCUIT FOR USE IN A VOLTAGE DETECTION CIRCUIT

BACKGROUND OF THE INVENTION

Voltage detection circuits, and particularly CMOS voltage detection circuits, that have the ability to provide an output signal once an input voltage has passed a certain voltage threshold are known in the art. Voltage detection circuits are important building blocks used in the design of many types of analog and mixed analog/digital integrated circuits. Current comparators are widely used, for example, in POR ("Power On Reset") circuits.

A POR circuit typically detects when the supply voltage for an integrated circuit reaches a predetermined acceptable level, and sends an output signal to reset internal memory elements on the integrated circuit. Voltage detection circuits, which compare the supply voltage against a known reference voltage, are often included in POR circuits to determine when a safe operating voltage is reached. The difficulty in designing POR circuits is threefold: first, the reference voltage must be generated from the same supply voltage that is ramped up to a final supply voltage; second, the reference voltage must not vary excessively over process, voltage and temperature ("PVT") conditions, or else the POR circuit sends out a signal prematurely, or not at all; and third, in the case of low voltage processes, the reference voltage used must be small (in the one volt range).

Typically, diode clamp and band-gap circuits have been used to generate a low voltage reference. However, because the voltage across a diode is very sensitive to temperature, diode clamp circuits cannot meet the strict voltage detection tolerances needed in some applications. Additionally, band-gap circuit, which provide a temperature-insensitive output voltage, usually contain too many components to be cost-effective when used in an integrated circuit application.

Referring now to FIG. 1, a typical diode clamp voltage detect circuit 10 is shown for generating an output voltage as the VDD voltage supply ramps up to a final supply voltage level. The VOUT voltage in detect circuit 10 tracks the VDD voltage, but at a lower voltage level determined by the ratio of the value of resistors R1 and R2, as well as the voltage drop across diode-connected transistor P1. Circuit 10 is not a good candidate for use in a POR circuit due to the temperature sensitivity of drain-to-source voltage drop across transistor P1.

Referring now to FIG. 2, another typical diode clamp voltage detect circuit 20 is shown for generating an output voltage as the VDD voltage supply ramps up to a final supply voltage level. The VOUT voltage in detect circuit 10 initially tracks the VDD voltage, but quickly levels out to a reference voltage level determined by the ratio of the value of resistors R1 and R2, as well as the voltage drop across diode-connected transistor N1. Circuit 20 is also not a good candidate for use in a POR circuit due to the temperature sensitivity of drain-to-source voltage drop across transistor N1.

Referring now to FIG. 3, a bandgap circuit is shown for generating an output voltage as the VDD voltage supply ramps up to a final supply voltage level. The VOUT voltage in detect circuit 30 also initially tracks the VDD voltage, but quickly levels out to a reference voltage level determined a bandgap circuit including a first transistor in parallel with the combination of a second transistor in series with a resistor, as well as a feedback circuit (not shown in FIG. 3). While circuit 30 is a good candidate for use in a POR circuit from a performance standpoint, it is not a good candidate for low voltage operation (bandgap of silicon, which is typically used is 1.1 volts) or from a cost standpoint due to the number of devices that must be used in the circuit.

What is desired, therefore, is a voltage detection circuit for providing a temperature-insensitive output voltage, but is realized with a design that can be economically implemented in an integrated circuit.

SUMMARY OF THE INVENTION

According to the present invention, a simple voltage detection circuit has few circuit elements, but provides a voltage output that is substantially temperature insensitive. The voltage detection circuit of the present invention includes a diode-connected transistor, a cascode-connected transistor, as well as first and second resistors coupled between ground and a ramped power supply voltage. The output voltage of the detection circuit is provided at the junction of the first and second resistors. The diode-connected transistor exhibits a negative temperature coefficient, i.e. the hotter the device becomes, the lower the NMOS threshold voltage becomes. However, the cascode-connected transistor is also placed in series with the diode-connected transistor. The on resistance of the cascode-connected transistor increases with temperature and thus the voltage dropped across the cascode-connected transistor also increases with temperature. By varying the size of the cascode device, the overall resistance of the device is varied, and thus the net change in voltage drop for high and lower temperature can be varied. Therefore, if the cascode-connected device is correctly sized, the negative and positive temperature coefficients of the diode-connected and cascode-connected devices can be substantially cancelled out. A graphical analysis can be used to properly select devices sizes for optimum operation.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
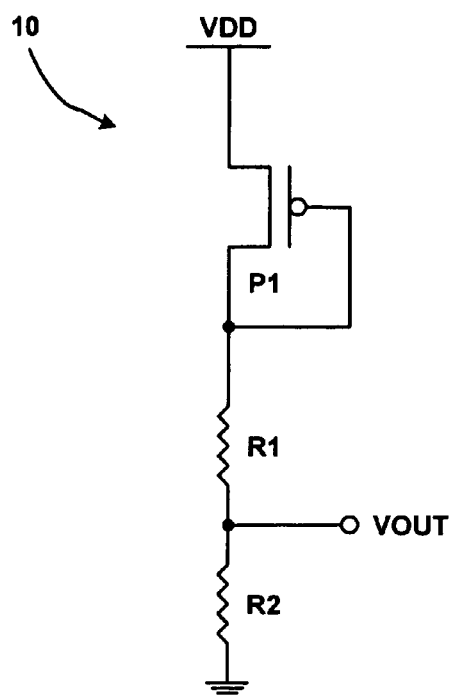
FIG. 1 is schematic diagram of prior art reference voltage circuit for use in a detection circuit using a P-channel transistor and a resistor divider that has temperature-sensitive output voltage.
Figure 2:
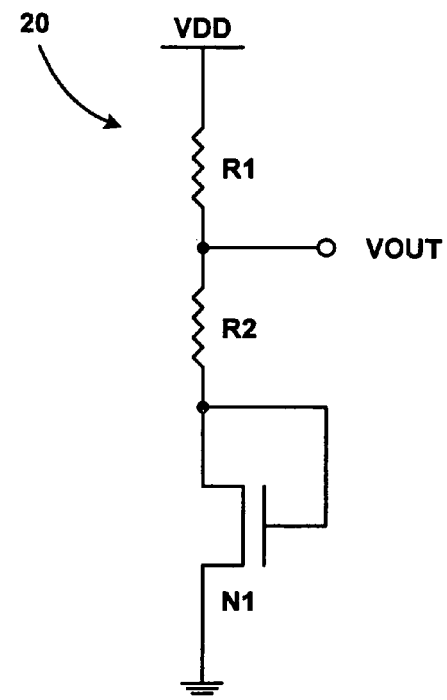
FIG. 2 is schematic diagram of prior art reference voltage circuit for use in a voltage detection circuit using an N-channel transistor and a resistor divider that also has temperature-sensitive output voltage.
Figure 3:
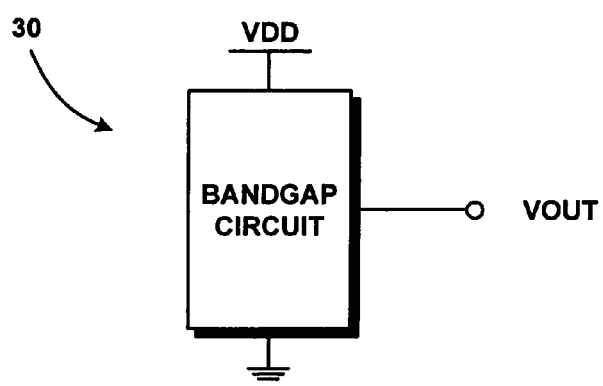
FIG. 3 is a schematic diagram of a prior art bandgap reference voltage circuit for use in a voltage detection circuit.
Figure 4:
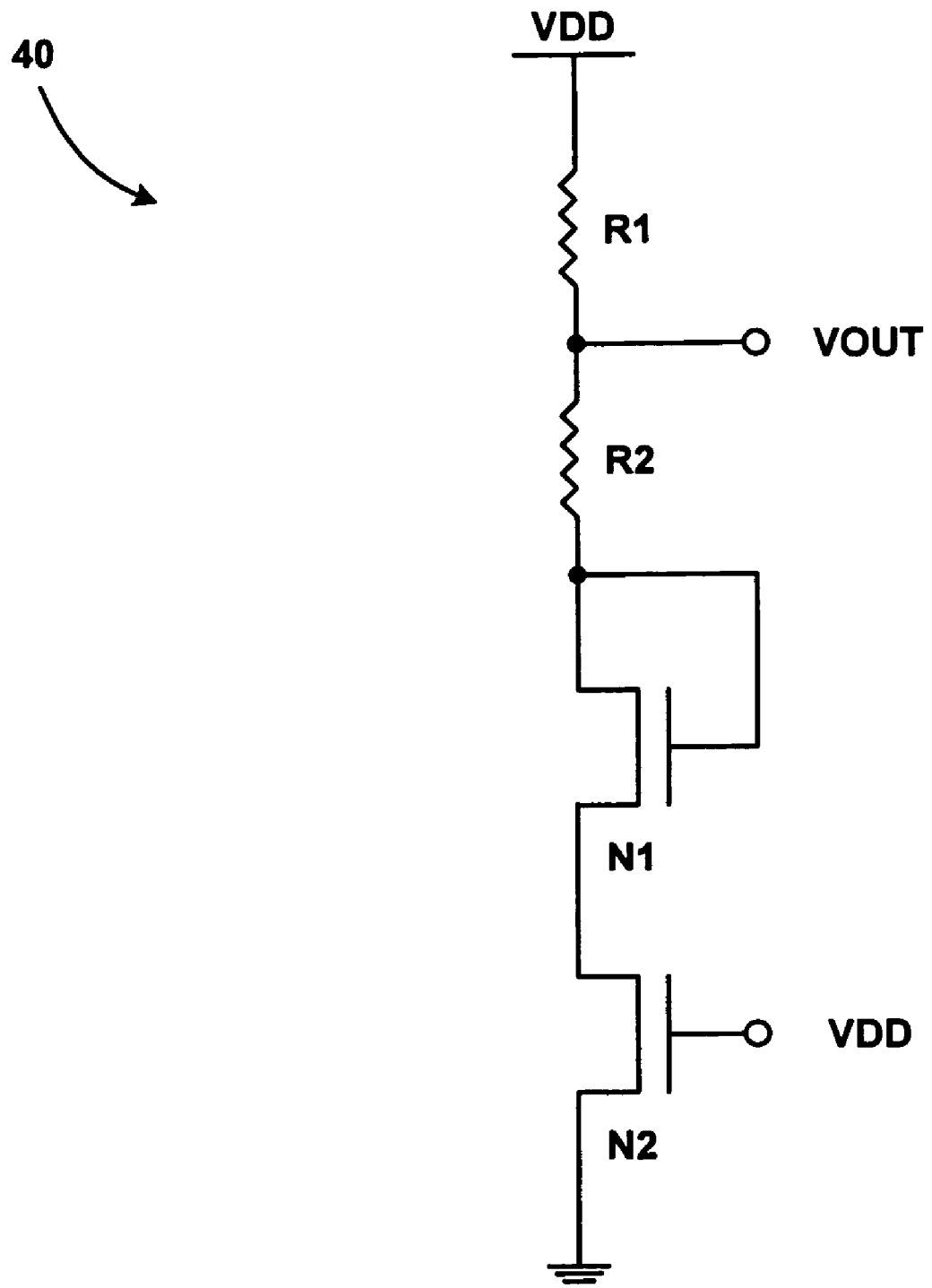
FIG. 4 is a schematic diagram of a reference voltage circuit according to the present invention for use in a voltage detection that has a substantially temperature-insensitive output voltage.

Referring now to FIG. 4, a schematic diagram of a reference circuit 40 used in a voltage detection circuit 40 according to the present invention that has a substantially temperature-insensitive output voltage is shown. Voltage detection circuit includes resistors R1 and R2, and transistors N1 and N2. Resistors R1 and R2, and the current paths of transistors N1 and N2 are serially coupled, and in turn coupled between VDD and ground. Transistor N1 is diode-connected, and transistor N2 is cascode-connected. In other words, the gate of transistor N1 is coupled to the drain of transistor N1, and the gate of transistor N2 is coupled to VDD. The VDD power supply ramps up to a final value such as 3.3 volts, or the like. The ground connection could also be a negative VSS supply. In FIG. 4, the value of resistor R1 is 10K ohms, and the value of resistor R2 is 1K ohms, but of course the values can be changed as required for a given application. The sizes of transistors N1 and N2 can be determined as set forth below.

In operation, the VOUT voltage is taken at the junction between resistor R1 and R2, and has a final voltage of about 0.8 volts. The function of detection circuit 40 is to provide a temperature invariant detection voltage VOUT. This is accomplished by the relative sizing of transistors N1 and N2 so that the positive and negative temperature coefficients are effectively cancelled for the given detection voltage.

The manner of sizing transistors N1 and N2 is as follows. In a first analytical method of sizing the transistors, an expression is created for VOUT (can also be referred to as VREF) in terms of the lengths (L) and widths (W) of transistors N1 and N2.

$$Vref = I_D R_2 + V_{DS_1} + I_D r_{ds_2} \quad [1]$$

$$Vref = Vdd - I_D R_1 \quad [2]$$

$$V_{DS_1} = V_T + \sqrt{\frac{L_1}{W_1}} \sqrt{\frac{2 I_D}{K}} \quad [3]$$

$$r_{ds_2} = \frac{1}{K \frac{W}{L}(Vdd - V_T)} \quad [4]$$

$$V_T = V_{TO} + T\left(\frac{\partial V_T(T)}{\partial T}\right) \quad [5]$$

where $\left(\frac{\partial V_T(T)}{\partial T}\right)$ is process dependent

Next, arbitrary values for L1, W1, L2, R1, and R2 are selected. These values can be set to meet other design goals such as static current in the reference leg, and area requirements. Note that R2<<R1. Next, obtain VT0+T[∂VT(T)/∂T] from design rules. Then, select the desired VOUT and targeted VDD and determine $I_D$ from equation [2]. Then, using equations [3] and [5], determine $\Delta V_{DS1}$ at the extremes of the temperature range for the circuit. Finally, using equation [4] and $\Delta V_{DS1}$, create the equation:

$$\Delta V_{DS1} = ID[rdsHOT - rdsCOLD],$$

and solve for W2.

In a second method, the sizing of transistors N1 and N2 can be determined numerically. In many circuit simulators (such as HSPICE) there are numerical equation solving utilities. They are typically of the following form:
parameter definition: .param w=opt1 (seed, low, high, step)
model definition: .model optmod opt1 cendif=1 . . .
simulation definition: .dc sweep optimize=op1

$$\text{measure goal:} \begin{array}{l} + \text{model } optmod \cdot \\ \phantom{+} meas \text{ dc } w \text{ find } VDD + \\ \phantom{+} \text{when } VREF1 = VREF2 + \\ \phantom{+} \text{goal} = VDDtarget \end{array}$$

A numerical solver of the above form can be configured to calculate the widths and lengths for two circuits simultaneously running at two different temperature extremes, thus determining the transistor sizes needed to make the reference (VOUT) voltage substantially insensitive to temperature.

Figure 5:
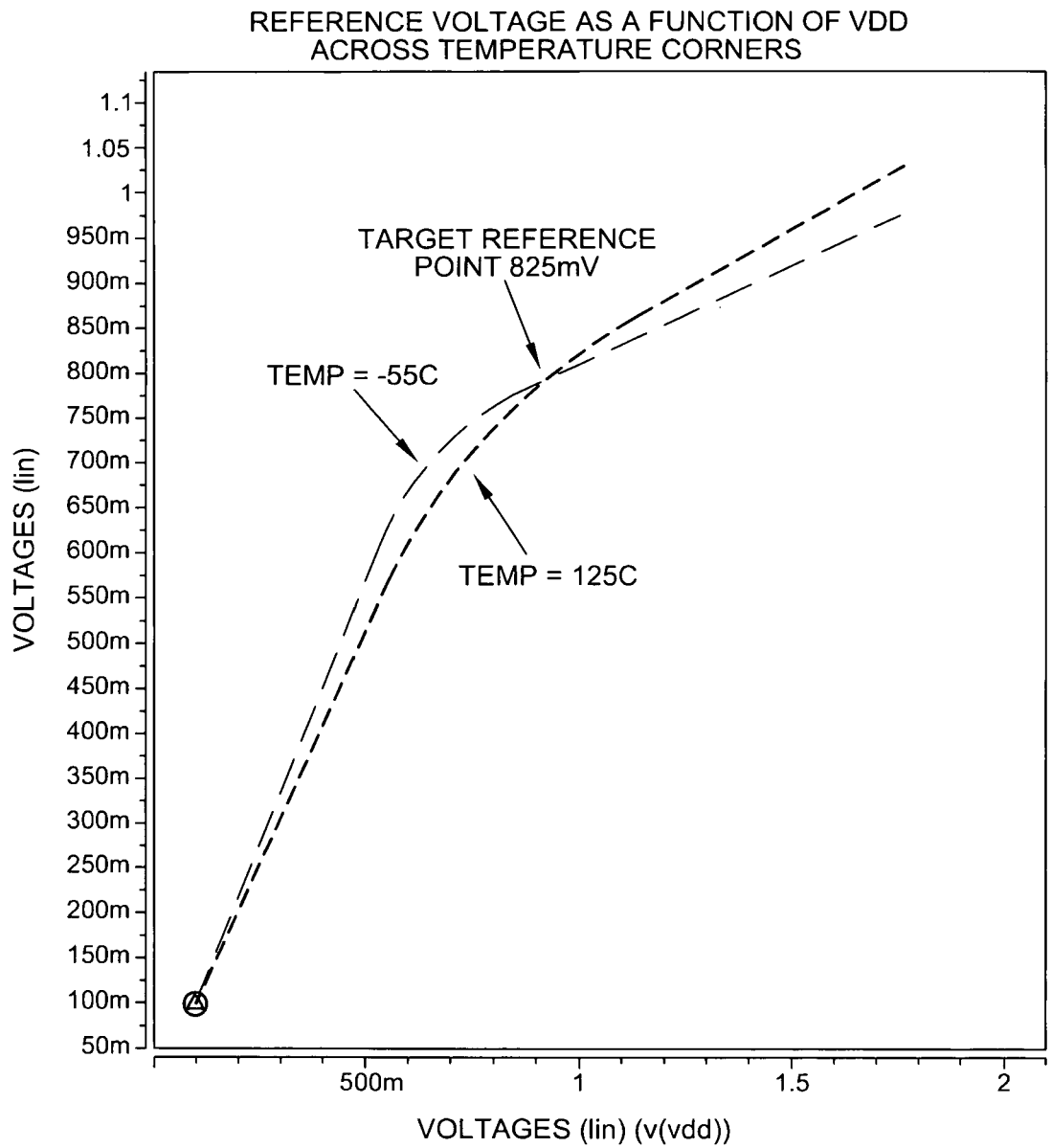
FIG. 5 is a plot of reference voltage versus ramped Vdd voltage in the voltage detection circuit of the present invention shown in FIG. 4 using a first trace determined by a first set of process conditions, and a second trace determined by a second set of process conditions.

Referring now to FIG. 5, a targeted reference voltage is required when VDD=1.2 volts. The value of the targeted reference voltage is 0.85 volts. It can be seen that the reference is substantially insensitive to temperatures ranging from −55° C. to 125° C. at the targeted reference voltage, because the curves from the −55° C. simulation and the 125° C. simulation intersect at the target reference voltage point.

Figure 6:
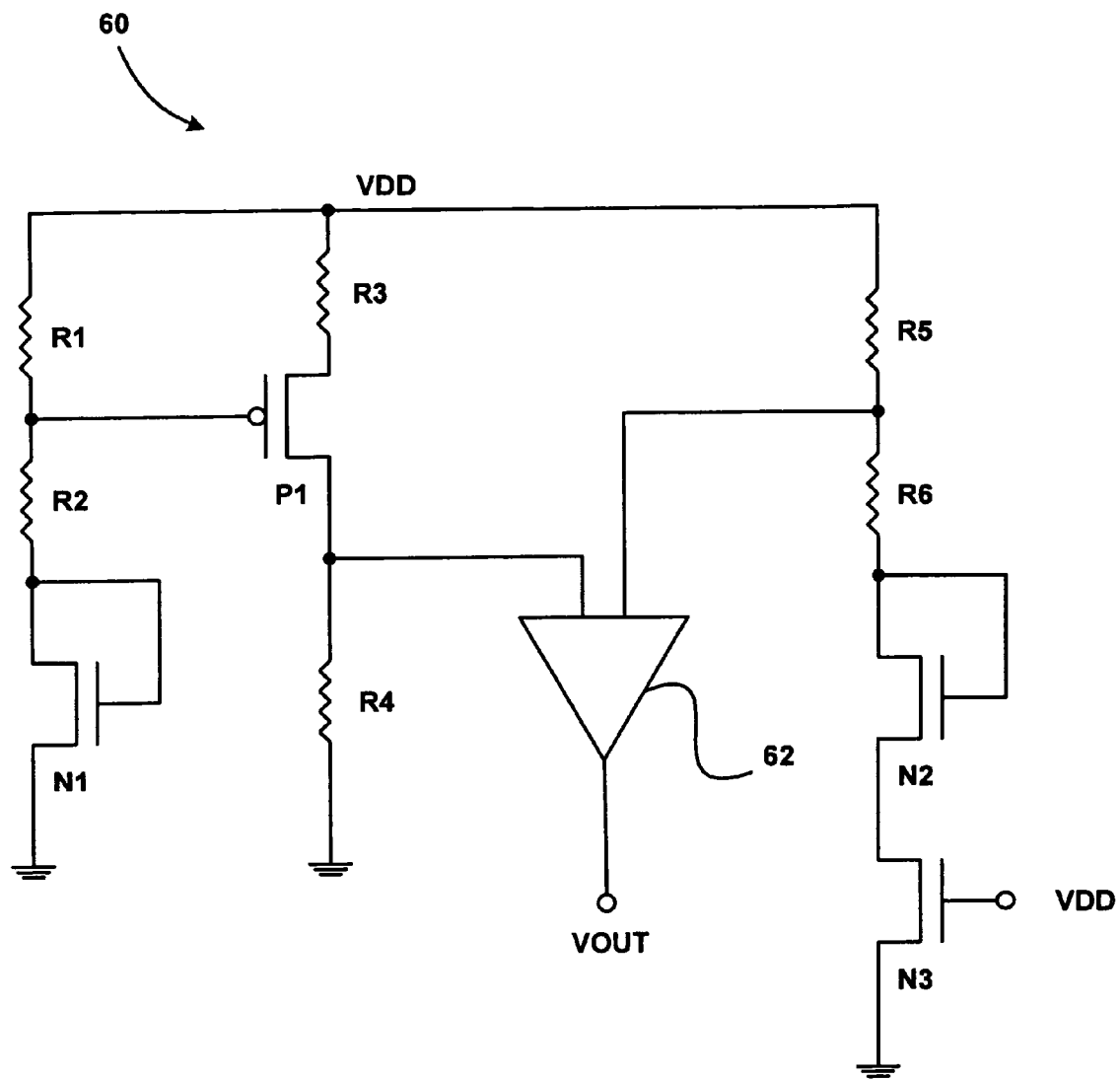
FIG. 6 is a schematic diagram of a POR circuit using a reference circuit according to the present invention.

Referring now to FIG. 6, a POR circuit 60 is shown using the reference generator of the present invention. The reference of the POR circuit 60 includes resistors R5 and R6, diode-connected transistor N2 and cascode-connected transistor N3 as previously described. In addition, the POR circuit 60 uses a voltage that is proportional to the VDD, which includes resistors R1 and R2, diode-connected transistor N1, resistors R3 and R4, and transistor P1. The temperature-stabilized reference voltage and the voltage proportional to VDD are compared by comparator 62 and an output voltage VOUT is provided when the VDD voltage passes a predetermined threshold.

Figure 7:
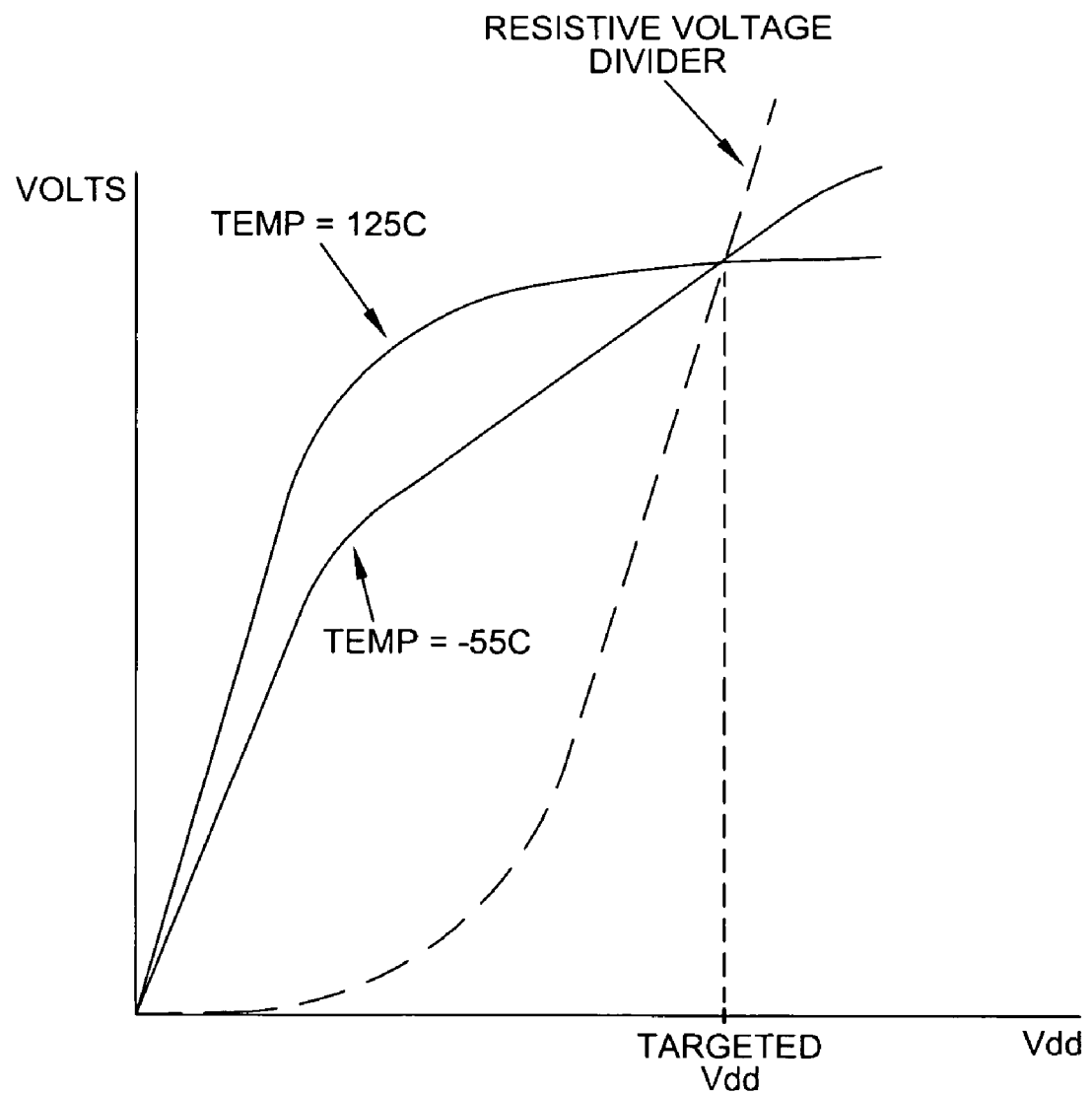
FIG. 7 is a plot of two voltages taken from the POR circuit of FIG. 6 showing little change in the output reference voltage at first and second operating temperatures, and first and second process conditions.

Referring to FIG. 7, a resistor divider is added to the temperature insensitive reference to demonstrate how the reference can be used to detect the point at which VDD reaches a targeted value.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A temperature compensated reference circuit operable throughout linear, saturated and sub-threshold regions for use in a voltage detection circuit comprising:

a cascode-connected transistor wherein the cascode-connected transistor includes a gate having a fixed voltage and is biased in a linear region;
a diode-connected transistor;
a first resistor; and
a second resistor,
wherein the cascode-connected transistor, the diode-connected transistor, the first resistor, and the second resistor are coupled in series between a first source of power supply voltage and a second source of power supply voltage, and
wherein the diode-connected transistor has a negative temperature coefficient, the resistance of the cascode-connected transistor has a positive temperature coefficient, and the size of the cascode-connected transistor is selected to substantially cancel the temperature coefficient of the detection circuit,
wherein a voltage output of the voltage detection circuit comprises the junction of the first and second resistors; and
wherein the cascode-connected transistor comprises a gate coupled directly to VDD.

2. The reference circuit of claim 1 wherein the first source of power supply voltage comprises VDD.

3. The reference circuit of claim 1 wherein the first source of power supply voltage comprises a ramping voltage level between ground and VDD.

4. The reference circuit of claim 1 wherein the second source of power supply voltage comprises ground.

5. The reference circuit of claim 1 wherein the voltage output provides a detection voltage of about one volt or less.

6. The reference circuit of claim 1 wherein the cascode-connected transistor comprises an N-channel transistor.

7. The reference circuit of claim 6 wherein a body connection of the N-channel transistor is coupled to ground.

8. The reference circuit of claim 1 wherein the diode-connected transistor comprises an N-channel transistor.

9. The reference circuit of claim 8 wherein a body connection of the N-channel transistor is coupled to ground.

10. A method for providing a temperature compensated reference voltage throughout linear, saturated and sub-threshold regions comprising:
providing a cascode-connected transistor wherein the cascode-connected transistor includes a gate having a fixed voltage and is biased in a linear region;
providing a diode-connected transistor;
providing a first resistor;
providing a second resistor;
coupling the cascode-connected transistor, the diode-connected transistor, the first resistor, and the second resistor in series between a first source of power supply voltage and a second source of power supply voltage;
selecting the size of the cascode-connected transistor to substantially cancel the temperature coefficient of the detection circuit; and
providing a voltage output at the junction of the first and second resistors,
wherein the cascode-connected transistor comprises a gate directly coupled to VDD.

11. The method of claim 10 wherein the first source of power supply voltage comprises VDD.

12. The method of claim 10 wherein the first source of power supply voltage comprises a ramping voltage level between ground and VDD.

13. The method of claim 10 wherein the second source of power supply voltage comprises ground.

14. The method of claim 10 wherein the voltage output provides a detection voltage of about one volt or less.

15. The method of claim 10 wherein the cascode-connected transistor comprises an N-channel transistor.

16. The method of claim 15 wherein a body connection of the N-channel transistor is coupled to ground.

17. The method of claim 10 wherein the diode-connected transistor comprises an N-channel transistor.

18. The method of claim 17 wherein a body connection of the N-channel transistor is coupled to ground.

* * * * *